United States Patent [19]

Cedrone

[11] Patent Number: 4,759,435
[45] Date of Patent: Jul. 26, 1988

[54] METERING AND SINGULATING APPARATUS FOR INTEGRATED CIRCUITS

[75] Inventor: Nicholas J. Cedrone, Wellesley Hills, Mass.

[73] Assignee: Daymarc Corporation, Waltham, Mass.

[21] Appl. No.: 801,096

[22] Filed: Nov. 22, 1985

[51] Int. Cl.[4] .............................................. B65G 47/26
[52] U.S. Cl. .................................... 198/459; 221/243; 221/260; 221/277; 271/120
[58] Field of Search ............... 198/459, 463.4, 534, 198/722, 723; 221/243, 260, 262, 277; 193/32, 40; 271/120, 182

[56] References Cited

U.S. PATENT DOCUMENTS

| | | | |
|---|---|---|---|
| 2,304,905 | 12/1942 | Gantzer | 198/459 |
| 3,869,117 | 3/1975 | Yoshimura | 271/182 X |
| 3,923,142 | 12/1975 | Rysti | 198/461 |
| 4,195,723 | 4/1980 | Loewenthal | 198/459 X |
| 4,475,733 | 10/1984 | Benson | 271/120 |

Primary Examiner—Joseph F. Peters, Jr.
Assistant Examiner—Paul E. Salmon
Attorney, Agent, or Firm—Wolf, Greenfield & Sacks

[57] ABSTRACT

An apparatus for metering and singulating electronic devices such as integrated circuits that are arrayed initially in a column. A support member positioned over one end of the column has a plurality of spaced apart coil springs that extend radially to engage a leading one of the devices. The support member rotates at a constant rate to carry one or more of the springs into engagement with the leading device, upon further rotation deflect the spring to store energy, and upon still further rotation, cause the spring or springs to snap back to their initial radial orientation thereby accelerating the leading device to separate it from the column.

7 Claims, 3 Drawing Sheets

METERING AND SINGULATING APPARATUS FOR INTEGRATED CIRCUITS

BACKGROUND OF THE INVENTION

This invention relates in general to apparatus for controlling the movement of discrete articles from a supply. More specifically, it recites to a device for metering and separating electronic devices from a column supply.

In the testing and handling of integrated circuits (IC's) and other electronic devices, the IC's are usually stored in columns, whether in elongated tubes or in guides of a test-handler machine. For example, in the Model 757 test handler of Daymarc Corporation, the assignee of the present application, IC's carried in tubes are stored on an inclined conveyor table, and then picked, one tube at a time, from the table. The tube is rotated to empty into a track leading to test sites where the IC's are momentarily brought to rest, connected to a test circuit, and then sorted according to the outcome of the test. At this input track, the IC's are fed from a column of IC's held in the tube at a rate controlled by a metering wheel that is placed over the track near the output end of the tube. The wheel has a continuous elastomeric element such as an O-ring mounted at its outer periphery. The O-ring frictionally engages the IC's so that the rotation of the wheel propels the devices at a rate set by the wheel. When the wheel is stationary, it blocks the movement of IC's along the track.

This arrangement has proven to have a variety of problems. First, the O-ring wheel does not separate the IC's from one another. As a column of IC's advances under the wheel, each device is propelled along the test track at the same velocity as the preceding and following devices. There is no "singulation" of the devices by the O-ring wheel, that is, a separation of the devices from one another where the devices are initially in a close-packed, abutting relationship. Singulation is desirable (1) so that optical or other sensors can count the number of devices being input, compute the input rate, and coordinate subsequent handling operations and (2) a physical separation is in general more conducive to reliable handling and testing. With this prior art O-ring wheel, separation occurs through the action of gravity as the lead IC is released from the wheel and is on a smooth, downwardly inclined track. The main problem with this is that the O-ring wheel must operate slowly as compared to the operating speed of other test handler components. Stated in other words, the present meter wheel is a bottleneck that limits the speed of operation of the entire test handler.

Another difficulty with the O-ring meter wheel is that the material of the O-ring is temperature sensitive. For example, if the wheel is operated in a cold environment, the O-ring material is stiffer than normal and provides a less reliable grip on the IC's it contacts and propels. If the grip is sufficiently poor, the metering wheel can slip over the IC's, which, of course, reduces its value as a meter. At high temperatures deterioration of the O-ring is accelerated.

Another related consideration is that IC's being handled have varying dimensions. Larger IC's have generally thicker bodies than smaller ones (ones having fewer pins and a smaller volume). Because the IC's are guided on a fixed track, variations in the body thickness, it is necessary to adjust the position of the axis of rotation of the O-ring wheel depending on the size of IC's being tested. Finally, with the present O-ring meter wheel, besides the non-singulation and other problems delineated above, there is a need to remove static electric charges that can accumulate on the devices at or near the metering site, shortly before testing. With the present O-ring arrangement it is necessary to use a material for the O-ring which is conductive as well as resilient so that that static charge can be drained to ground.

While members such as brushes could be used in place of the O-ring, they also have deficiencies. With a brush, the bristles tend to interfere with one another to produce a continuous, non-singulating propulsion similar to that achieved with the O-ring. Stated in other words, the energy stored in a bristle as it deflects is damped by the presence and action of adjacent, closely-packed bristles. This interference and damping occurs with both wire and non-metallic bristles.

It is therefore a principal object of this invention to provide a mechanical metering apparatus that accelerates and singulates articles arrayed in a column.

Another pincipal object is to provide such a metering and singulating apparatus which can operate at higher speeds than previously possible with O-ring wheels.

A further object is to provide a metering and singulating apparatus with the foregoing advantages which can accommodate articles of varying dimensions, is highly wear reistant, and which is substantially insensitive to variations in temperature.

Yet another object is to provide an apparatus with the foregoing advantages that is mechanically simple, has a comparatively low cost of manufacture, and is highly reliable.

SUMMARY OF THE INVENTION

The present invention is a mechanical metering and singulating apparatus particularly useful in feeding IC's, one at a time, with a separation between successive IC's, from a column of IC's to other components of a test handler such as holding guides of a preheat assembly. It has a support structure, preferably a hub, positioned near a feed end of the column. The hub is mounted on a rotating drive shaft that is positioned over a guide path for the IC's. The shaft and hub rotate at a constant speed for a given metering rate. A set of resilient members, preferably metallic coil springs, are mounted at one end in the hub to project from the hub in a radial array (hereinafter freely mounted). The hub-to-IC spacing is selected in conjunction with the projecting length of the springs so that as the hub rotates, at least one, and usually several springs (i) contact the IC, (ii) with continued rotation deflect to store spring energy, and then (iii) with still further rotation, snap back to their initial undeflected orientation thereby propelling the IC from the apparatus and separating it from the immediately following IC. The angular spacing between adjacent springs is sufficient to ensure that each spring can engage, deflect and propel as described above without substantial interference from other such springs.

In one form for the metering and singulation of a single column of IC's, the springs are generally arrayed in a single plane orthogonal to the axis of rotation. While the hub can be grounded to drain any static electric charge on the IC's through the metallic coil springs, in one form the springs each carry a coupling tip at its free end to frictionally enage the IC more reliably.

These and other features and objects of this invention will be more fully understood from the following detailed description which should be read in light of the accompanying drawings.

DETAILED DESCRIPTION OF THE PREFERRED EMBODIMENTS

Figure 1:
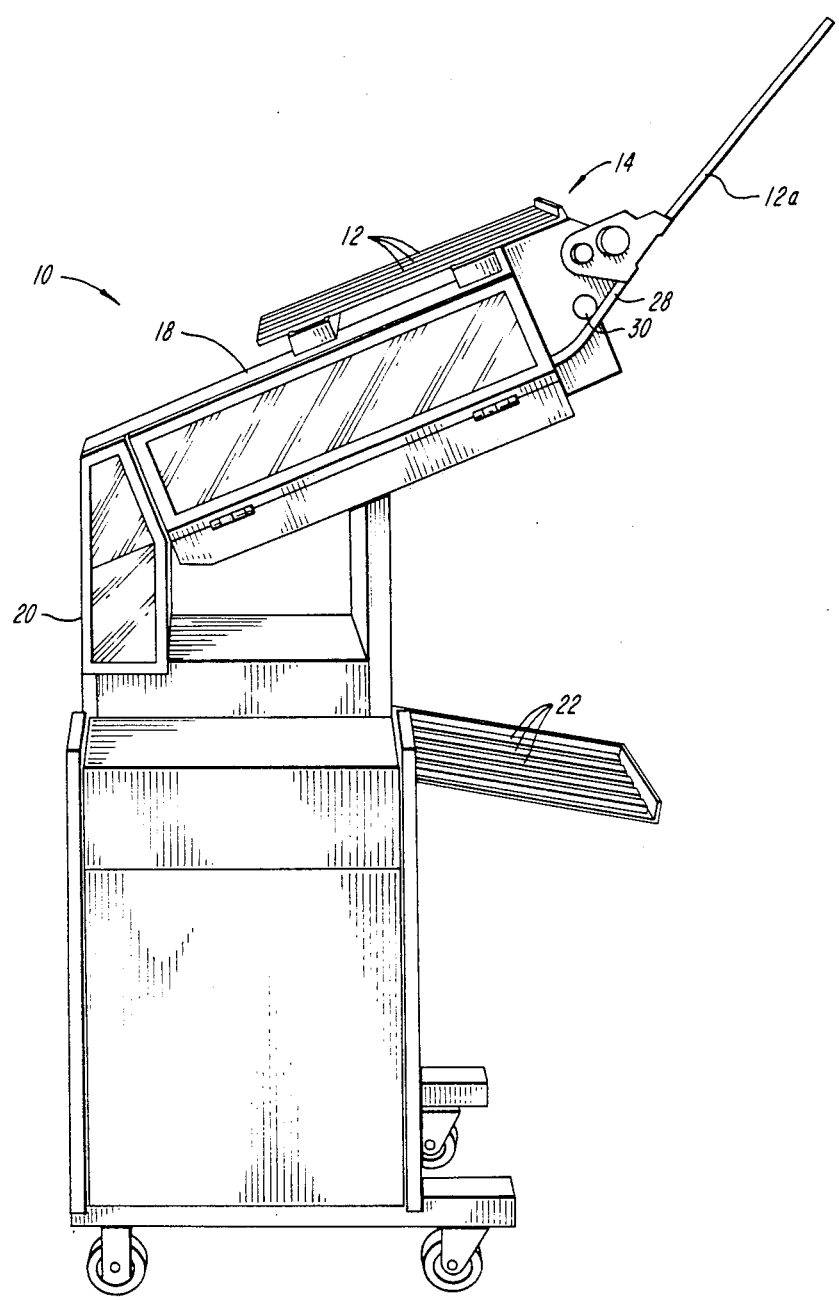
FIG. 1 is a front view in perspective of an IC test handler utilizing a mechanical metering and singulating apparatus according to the present invention.
Figure 2:
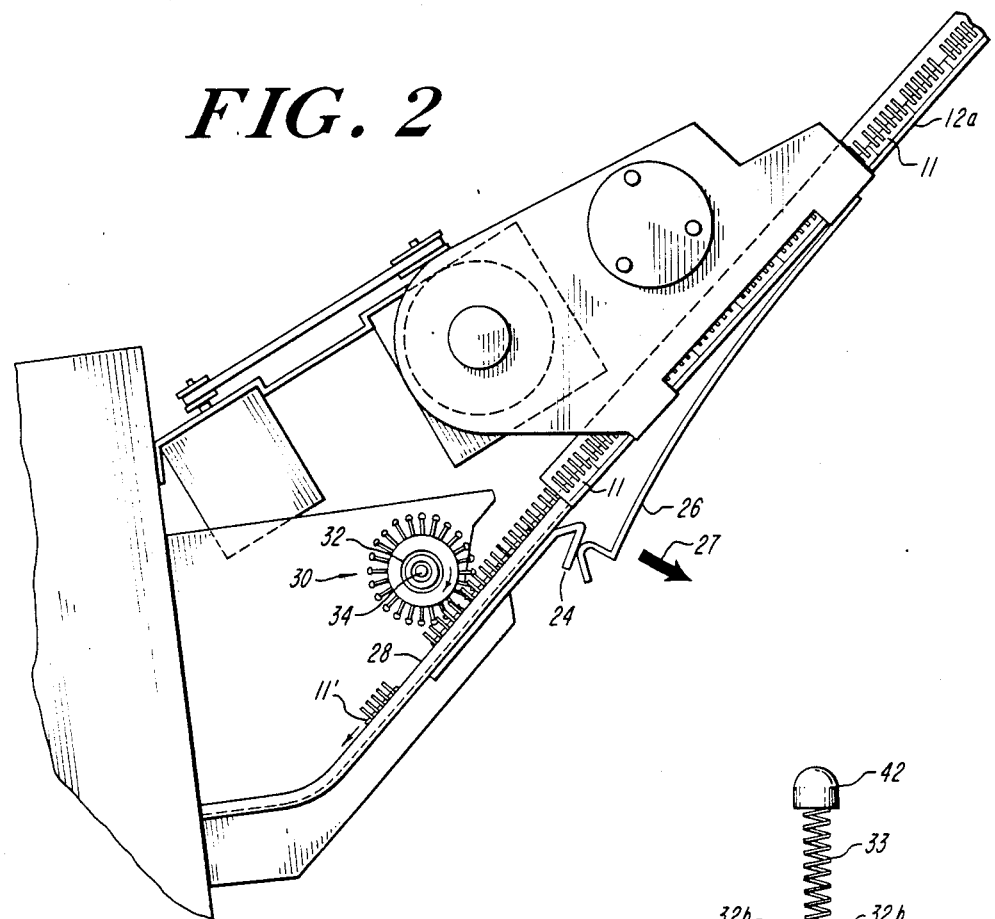
FIG. 2 is a detailed view in side elevation of the IC metering and singulating feed arrangement of test handler shown in FIG. 1.

FIG. 1 shows a high speed machine 10 for handling and testing integrated circuits 11 (IC's) having any of a wide range of sizes. The machine illustrated in a Model 757 test handler sold by Daymarc Corporation of Waltham, Mass. The IC's 11 are stored in plastic tubes 12 that are first held on an accumulating conveyor table 14 that carries them to a pick-off point where a robot arm 16 grips the upper end of the lead tube and rotates it to a feed position 12a (FIGS. 1 and 2). In the feed position 12a the open upper end of the tube becomes the lower end. The IC's therefore feed gravity from an end-to-end column in the tube 12a to a holding rail (not shown) in a preheat assembly 18. After the IC's reach a preselected temperature in the assembly 18, they are fed to a test site in the unit 20, and depending on the results of the test, to one of the output tracks 22.

With particular reference to FIG. 2, as a tube 12a reaches the feed position, a fixed cam 24 engages and moves a spring stop 26 in the direction of arrow 27 to allow the IC's held in the tube to slide out of the tube under the influence of gravity into a preheat assembly input feed track 28. As shown, the IC's 11 are oriented with their pins facing upwardly. At this point it is important to meter the movement of IC's into the preheat assembly (which must index a new storage track into the feed position when the preceding track is filled). To this end it is valuable to separate the IC's from one another as they proceed along the track 28 so that a conventional optical system (not shown) can count the IC's being loaded into the preheat assembly.

Figure 3:
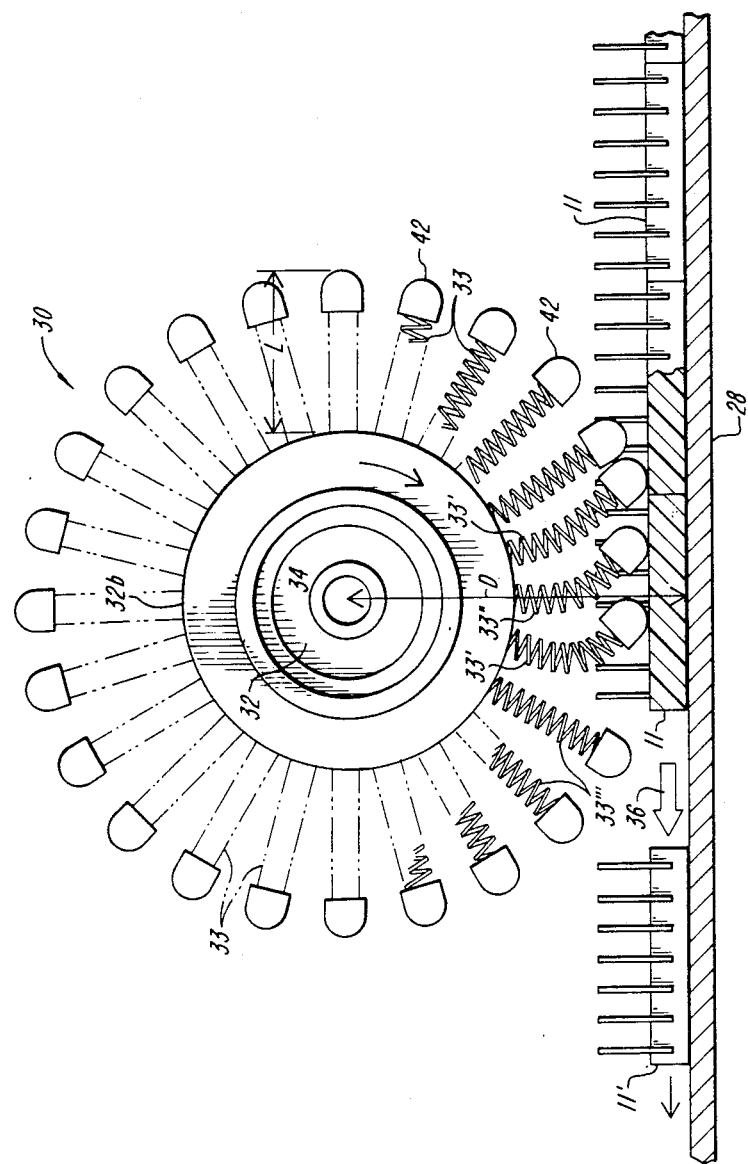
FIG. 3 is a further detailed view of the metering and singulating apparatus shown in FIG. 2.

A principal feature of this invention is a spring wheel meter 30 having a hub 32, a plurality of coil springs 33 freely mounted in and extending radially outwardly from the hub in a mutually spaced relationship, and a drive shaft 34 that supports and rotates the hub and the springs. As indicated in FIGS. 2 and 3, the wheel rotates in a direction so that its lower springs have a component of velocity that is generally in the same direction as the path of advance 36 of the IC's 11 along the track 28 from the tube 12a to the preheat assembly 18. The shaft 34 is fixed in position over the track 28, and spaced from both the track and the output end of the tube 12a. The spacing D between the axis of rotation of the shaft and the upper surface of the track 28 is adjustable and is selected in combination with the length L of the springs so that at least one spring on the wheel meter 30 extends into the path of travel 36 of the IC's 11 along the track 38 to block, when the wheel meter 30 is stationary, the advance of any IC along the path.

The spring L and spacing D are also selected so that at least one spring (spring 33') contacts the upper surface of the leading IC in the column of IC's unloading from the tube 12a. After making this contact, continued rotation of the wheel meter 30 causes the spring 33' and, as shown, the following spring 33" to deflect, as shown in FIG. 3, to store energy. The rotation during this contact also advances the IC along the path 36 in coordination with the rotation of the wheel meter 30. Still further rotation of the wheel meter places the contacting springs in a position (33''', 33'''') where they snap back to their initial undeflected orientation. This accelerates the leading IC 11' away from the column to separate and singulate from the following IC's in the column.

The springs 33 lie generally in a common plane that is orthogonal to the axis of rotation of the wheel 30 and its drive shaft 34. They are also mutually angularly spaced about the periphery of the wheel. The spacing being sufficient that one spring, as it deflects through engagement with an IC does not have the presence or movement of other springs 33 interfere with its deflection and then its snap-back propulsion of the leading IC. As shown in FIG. 3 adjoining spring 33, when in contact with the same IC, may touch one another, but their action remains substantially independent and cooperative. This cooperation can occur through the trailing spring resisting the propulsion of the IC until the leading spring has deflected to a larger degree than would otherwise occur. Also, when the leading spring snaps back to cause the propulsion, this triggers the coordinated release of energy stored in the trailing spring through its deflection.

Figure 5:
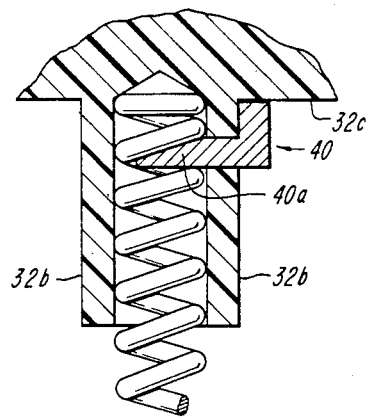
FIG. 5 is a detailed view of an arrangement for securing the springs shown in FIGS. 2–4.
Figure 4:
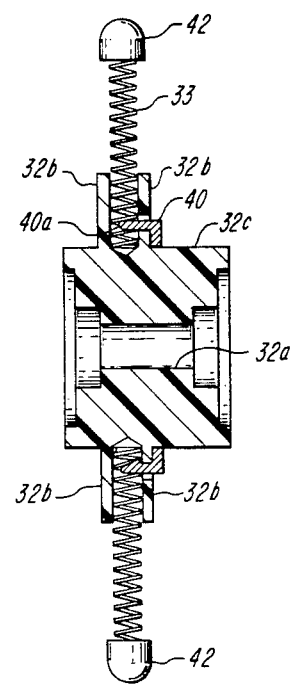
FIG. 4 is a view in vertical section through the center of the apparatus shown in FIG. 3.

FIGS. 4 and 5 illustrate the construction details of the wheel 30. The drive shaft 34 is secured in a central passage 32a of the hub. The hub is generally symmetrical about the axis of rotation of the shaft. With a generally cylindrical outer surface 32C. The springs 33 are mounted between a pair of flanges 32b, 32b spaced axially from one another by the width of the springs and extending outwardly from the outer surface 32C. A retaining ring 40 slides over the hub and has at least one lip 40a that penetrates an opening in one of the flanges 32b to engage and secure the springs 33. Tips 42 of a resilient material with good frictional qualities are preferably secured on the free ends of each spring 33 to enhance the grip of the spring on the IC during the deflection and propulsion and to stabilize the location of the spring tip on the IC during the deflection. The tips 42 can also be formed of a material that is conductive to leak static electric charges from the IC to ground through the metallic springs 33.

This spring wheel meter system can accommodate and singulate IC's with varying dimensions since the springs are flexible. In fact, it is to some extent self adjusting since a larger device bends the spring or springs to a greater degree, and therefore stores more energy for the singulating propulsion. The spring wheel of the present invention also avoids the wear and temperature sensitivity problems encountered with prior art O-ring arrangements.

While this invention has been described with respect to its preferred embodiments, it will be understood that various modifications and variations will occur to those skilled in the art from the foregoing description and drawings. For example, while the resilient members have been described as coil springs, leaf springs can also be used. Also, while a single plane of springs mounted on a hub has been disclosed to meter and singulate a column of articles, it is possible to array the springs axially as well as radially to propel wider articles or multiple columns of articles. These and other modifications and variations are intended to fall within the scope of the pending claims.

What is claimed is:

1. Apparatus for successively feeding and separating, at a controlled rate, electronic devices from a supply of said devices arrayed in a column, comprising,
   a support structure spaced closely from a feed end of said column,
   means for rotating the support structure at a controlled rate,
   a plurality of coil springs freely mounted on said support structure with a radial orientation and mutually spaced from one another,
   each of said coil springs being sufficiently long that as said support structure rotates it engages one of said devices, and with continued rotation deflects to resiliently store energy, and upon further rotation springs to its initial radial orientation thereby to accelerate said device, and
   said mutual spacing being such that (i) said coil springs do not interfere with said deflection of adjacent ones of said coil springs and (ii) successive ones of said devices are accelerated intermittently to produce a separation between said accelerated device and other of said devices remaining in said column.

2. The apparatus of claim 1 wherein said rotation is at a uniform rate.

3. The apparatus of claim 1 wherein said coil springs lie generally in a single plane orthogonal to the axis of rotation of said support structure.

4. The apparatus of claim 1 further comprising friction coupling means secured at the outer end of each of said coil springs to enhance the engagement of said coil springs to said devices.

5. The apparatus of claim 1 wherein said support structure comprises a hub having a generally circular periphery centered on the axis of said rotation.

6. The apparatus of claim 5 wherein said coil springs each extend radially for a distance that produces said deflection and acceleration for devices of varying thickness.

7. The apparatus of claim 1 wherein said coil springs are metallic to ground said devices.

* * * * *